(12) United States Patent
Zhu et al.

(10) Patent No.: US 12,082,419 B2
(45) Date of Patent: Sep. 3, 2024

(54) SEMICONDUCTOR STRUCTURE AND FORMING METHOD THEREFOR, AND MEMORY AND FORMING METHOD THEREFOR

(71) Applicant: CHANGXIN MEMORY TECHNOLOGIES, INC., Hefei (CN)

(72) Inventors: Yiming Zhu, Hefei (CN); Erxuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/444,785

(22) Filed: Aug. 10, 2021

(65) Prior Publication Data

US 2021/0375939 A1 Dec. 2, 2021

Related U.S. Application Data

(63) Continuation of application No. PCT/CN2021/086466, filed on Apr. 12, 2021.

(30) Foreign Application Priority Data

Apr. 27, 2020 (CN) .......................... 202010344169.4

(51) Int. Cl.
*H10B 51/20* (2023.01)
*G11C 7/18* (2006.01)
*H10B 51/10* (2023.01)

(52) U.S. Cl.
CPC .............. *H10B 51/20* (2023.02); *G11C 7/18* (2013.01); *H10B 51/10* (2023.02)

(58) Field of Classification Search
CPC .... H10B 51/20; H10B 51/10; H10B 12/0335; H10B 12/05; H10B 12/482; H10B 53/30;
(Continued)

(56) References Cited

U.S. PATENT DOCUMENTS 8,263,440 B2 9/2012 Kim
9,431,402 B2 8/2016 Ji
(Continued)

FOREIGN PATENT DOCUMENTS

CN 102468181 B 3/2016
CN 108461496 A 8/2018
(Continued)

OTHER PUBLICATIONS

International Search Report in the international application No. PCT/CN2021/086466, mailed on Jul. 2, 2021.
(Continued)

*Primary Examiner* — Thanh T Nguyen
(74) *Attorney, Agent, or Firm* — Syncoda LLC; Feng Ma

(57) ABSTRACT

A method for forming the semiconductor structure includes: providing a substrate, forming a sacrificial layer and an active layer on the sacrificial layer on the substrate; etching the active layer and the sacrificial layer to form active lines extending along a first direction; forming a first isolation layer that fills a spacing between the active lines; etching ends of the active lines to form openings, and exposing the sacrificial layer on side walls of the openings; removing the sacrificial layer along the openings, and forming gap between a bottom of the active lines and the substrate; and filling the gaps with a conductive material to form bit lines extending along the first direction.

9 Claims, 18 Drawing Sheets

(58) Field of Classification Search
CPC ........ H10B 61/22; H10B 63/34; H10B 12/02; H10B 12/30; G11C 7/18; H01L 29/66666; H01L 29/7827; H01L 29/78642; H01L 27/088; H01L 21/8234
See application file for complete search history.

(56) References Cited

U.S. PATENT DOCUMENTS

| | | |
|---|---|---|
| 2012/0009760 A1 | 1/2012 | Kim |
| 2013/0161710 A1 | 6/2013 | Ji |
| 2019/0074363 A1 | 3/2019 | Zhu |
| 2019/0157345 A1 | 5/2019 | Zhu et al. |
| 2021/0335789 A1* | 10/2021 | Zhu .................. H01L 29/78642 |

FOREIGN PATENT DOCUMENTS

| | | |
|---|---|---|
| CN | 109461738 A | 3/2019 |
| CN | 110383476 A | 10/2019 |
| CN | 211719592 U | 10/2020 |
| WO | 2020042255 A1 | 3/2020 |

OTHER PUBLICATIONS

Supplementary European Search Report in the European application No. 21797030.0, mailed on Sep. 15, 2022.

\* cited by examiner

SEMICONDUCTOR STRUCTURE AND FORMING METHOD THEREFOR, AND MEMORY AND FORMING METHOD THEREFOR

CROSS-REFERENCE TO RELATED APPLICATIONS

This is a continuation of International Patent Application No. PCT/CN2021/086466 filed on Apr. 12, 2021, which claims priority to Chinese Patent Application No. 202010344169.4 filed on Apr. 27, 2020. The disclosures of these applications are hereby incorporated by reference in their entirety.

BACKGROUND

A memory usually includes a data memory cell and a control transistor for controlling the data memory cell. An integration density of the transistor restricts a storage density of the memory. For planar transistors, a channel size of the transistor is reduced to decrease a size of the transistor, thereby increasing the storage density of the memory.

SUMMARY

Embodiments of the present disclosure relate to the technical field of semiconductors, and more specifically to a semiconductor structure and a method for forming thereof, and a memory and a method for forming thereof.

Some embodiments of present disclosure provide a semiconductor structure and a method for forming thereof, and a memory and a method for forming thereof.

The embodiments of present disclosure provide a method for forming a semiconductor structure, including: providing a substrate, a sacrificial layer and an active layer on the sacrificial layer are formed on the substrate; etching the active layer and the sacrificial layer to form active lines extending along a first direction; forming a first isolation layer that fills spacing between the various active lines; etching ends of the active lines to form openings exposing the sacrificial layer; removing the sacrificial layer along the openings to form gaps between a bottom of the active lines and the substrate; and filling the gaps with a conductive material to form bit lines extending along the first direction.

The embodiments of present disclosure further provide a memory, including the foregoing semiconductor structure, and a memory cell located above the semiconductor structure, and the memory cell electrically connected to the second doped region.

The embodiments of present disclosure further provide a method for forming a memory, including: providing the above-mentioned semiconductor structure; and forming a memory cell on the semiconductor structure, and the memory cell being electrically connected to the second doped region.

In the method for forming a semiconductor structure which provided by the embodiments in this disclosure, the sacrificial layer and the active layer on the sacrificial layer are formed on the substrate; the position of the sacrificial layer is replaced with a bit line to form a buried bit line, thereby facilitating subsequent forming of a vertical transistor, and the source/drain at the bottom of the vertical transistor being led out through the bit line.

BRIEF DESCRIPTION OF THE DRAWINGS

In order to describe the technical solutions of the embodiments in this disclosure more clearly, the accompanying drawings required to be used in the embodiments of this disclosure will be simply introduced below. It is apparent that the accompanying drawings in the following descriptions are only some embodiments of this disclosure. Those of ordinary skill in the art may further obtain other accompanying drawings according to these accompanying drawings without creative work.

DETAILED DESCRIPTION

In order to make the objectives, technical means, and effects thereof of this disclosure clearer, this disclosure will be described further below in conjunction with the accompanying drawings. It is to be understood that the embodiments described here are only part of the embodiments of this disclosure, not all of the embodiments, and not intended to limit this disclosure. All other embodiments obtained by those of ordinary skill in the art on the basis of the embodiments in this disclosure without creative work shall fall within the scope of protection of this disclosure.

With a decrease of the channel size of the transistor, the narrow channel effect and the short channel effect can lead to the degradation of transistor performance, which affects the performance of the memory and restricts the further improvement of the size of the transistor and the storage density of the memory.

Refer to FIG. 1 to FIG. 12C. FIG. 1 to FIG. 12C are schematic structural diagrams of a process of forming a semiconductor structure according to an embodiment of this disclosure.

Figure 1:
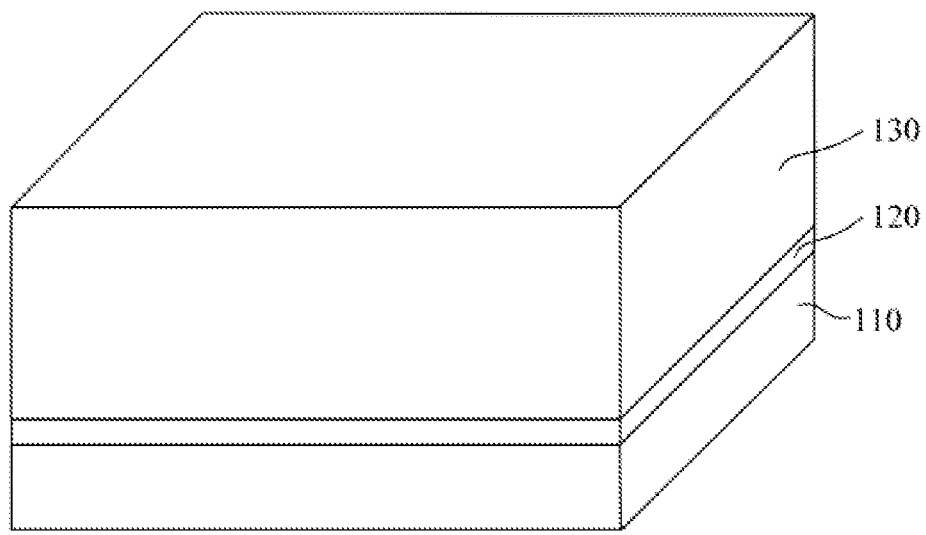
FIG. 1 is a first schematic structural diagram of a process of forming a semiconductor structure according to an embodiment of this disclosure.

Referring to FIG. 1, a substrate 110 is provided. A sacrificial layer 120 and an active layer 130 on the sacrificial layer are formed on the substrate 110.

The substrate 110 can be made of various semiconductor materials such as Si, Ge, or SiC, can be of a single-layer structure, and can also be of a compound structure, which is not limited herein.

The sacrificial layer 120 and the active layer 130 are sequentially formed on the substrate 110. The active layer 130 uses a semiconductor material such as Si, Ge, or Sic, and can use one or more of the semiconductor materials. The sacrificial layer 120 is made of a material different from those of the substrate 110 and the active layer 130, therefore influences to the substrate 110 and the active layer 130 in a subsequent process of removing the sacrificial layer 120 can be reduced.

In the embodiment, the substrate 110 is a silicon substrate, the sacrificial layer 120 is a SiGe layer, and the active layer is a silicon layer. After the sacrificial layer 120 is epitaxially formed on the substrate 110 by an epitaxial growth process, the active layer 130 is then formed on the sacrificial layer 120 through the epitaxial process.

In fact, as long as the sacrificial layer 120 is made of a different material from those of the substrate 110 and the active layer 130, in the process of removing the sacrificial layer 120, the sacrificial layer 120 can achieve a high etch selectivity compared to the substrate 110 and the active layer 130.

In some embodiments, the substrate 110, the sacrificial layer 120, and the active layer 130 each can be of a Silicon-On-Insulator (SOI) structure, and buried oxide in the SOI structure serves as the sacrificial layer 120.

In other embodiments, a bulk-silicon substrate may be subjected to ion implantation, therefore a doped layer is formed inside the bulk-silicon substrate to serve as the sacrificial layer 120. For example, Ge is implanted into bulk-silicon; by controlling an implantation depth of Ge, a SiGe layer is formed inside the bulk-silicon to serve as the sacrificial layer 120, a silicon layer under the doped layer serves as the substrate 110, and a silicon layer on the doped layer serves as the active layer. In other embodiments, the doped layer can be formed by implantation of other elements, such as C, O, or N, and an etch rate of the doped layer is different from those of a material layer above and a material layer below, and thus the sacrificial layer 120 is formed. Preferably, the sacrificial layer 120 can be made of a material such as silicon oxide, silicon nitride, silicon oxynitride, or silicon oxycarbide.

The active layer 130 is used for forming a vertical transistor, and the sacrificial layer 120 is used to be substituted to form a bit line in a subsequent process. According to a size of the vertical transistor to be formed and a size of the bit line, a thickness of the sacrificial layer 120 and a thickness of the active layer 130 are reasonably set. In one embodiment, the thickness of the sacrificial layer can be 35 nm to 50 nm, and the thickness of the active layer 130 can be 100 nm to 1000 nm.

Figure 2:
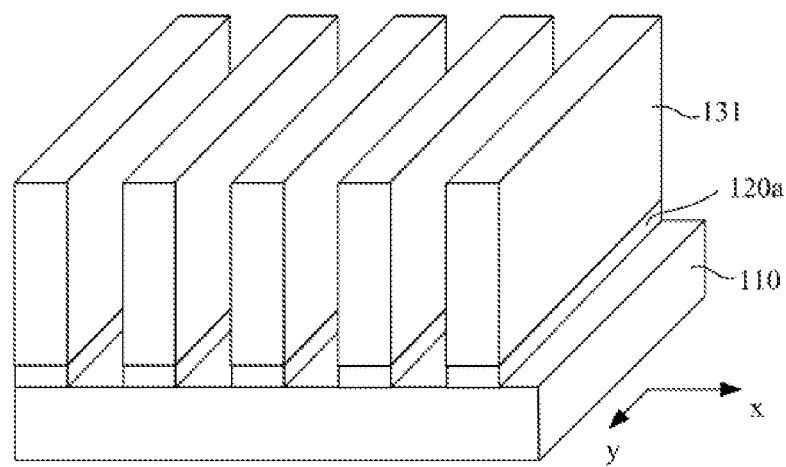
FIG. 2 is a second schematic structural diagram of a process of forming a semiconductor structure according to an embodiment of this disclosure.

Referring to FIG. 2, the active layer 130 and the sacrificial layer 120 are etched to reach the substrate 110, therefore a plurality of active lines 131 that are arranged in parallel and extend long a first direction are formed.

In the embodiment, a method for forming the active lines 131 further includes: forming a patterning mask layer (not shown in the figure) on the active layer 130, herein opening patterns extending along the first direction are provided in the patterning mask layer; with the patterning mask layer as a mask, etching the active layer 130 and the sacrificial layer to form elongated active lines 131 and elongated sacrificial layers 120a.

In the embodiment, the first direction refers to a y-direction. The active layer 130 and the sacrificial layer 120 are etched by a dry etching process. In corresponding etching stages, corresponding etching gases are selected for etching the active layer 130 and the sacrificial layer 120.

Figure 3:
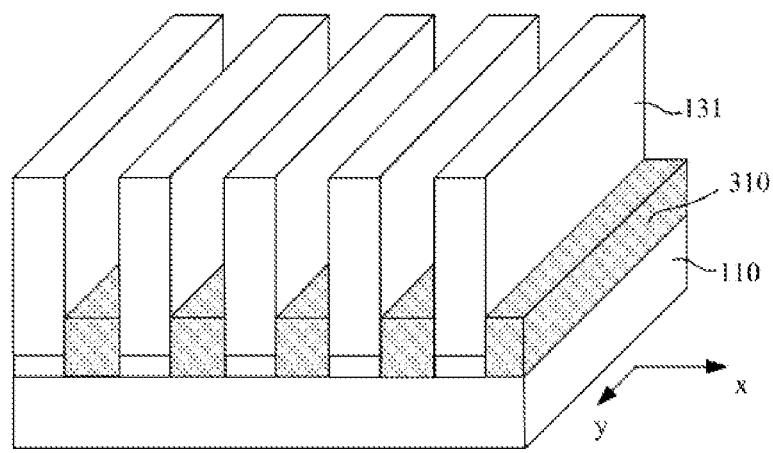
FIG. 3 is a third schematic structural diagram of a process of forming a semiconductor structure according to an embodiment of this disclosure.

Referring to FIG. 3, a transitional layer 310 with doping elements is formed on the substrate 110 between adjacent active lines 131.

The transitional layer 310 with a certain thickness can be formed by etching back after deposition of a transitional layer material on the substrate 110. The thickness of the transitional layer 130 can be adjusted according to dimensional requirements of a source/drain region of the transistor to be formed.

The transitional layer 310 and the active layer 131 are different in materials, which can be materials that facilitate diffusion of impurities, for example, polycrystalline silicon, and can also be other materials, for example, dielectric materials such as silicon oxide, silicon nitride, or silicon oxynitride.

A method for forming the transitional layer 310 with doping elements includes: after a transitional layer 310 with a certain thickness without being doped is formed on the substrate 110, performing ion implantation to achieve doping of the transitional layer 310. Here, tops of the active lines 131 are covered with the patterning mask layer. By controlling energy of ion implantation, only the transitional layer 310 can be doped through ion implantation. Based on types of the transistor to be formed, N-type ions or P-type ions or atomic clusters with N-type ions or P-type ions can be implanted to the transitional layer 310. The doping elements in the transitional layer 310 can exist in the form of ions, atoms, compound molecules, or clusters.

In other embodiments, in a process of forming the transitional layer 310, doping gases with doping elements can be added in deposition process gases through the in-situ doping process, therefore the transitional layer 310 with doping elements is directly formed.

Figure 4:
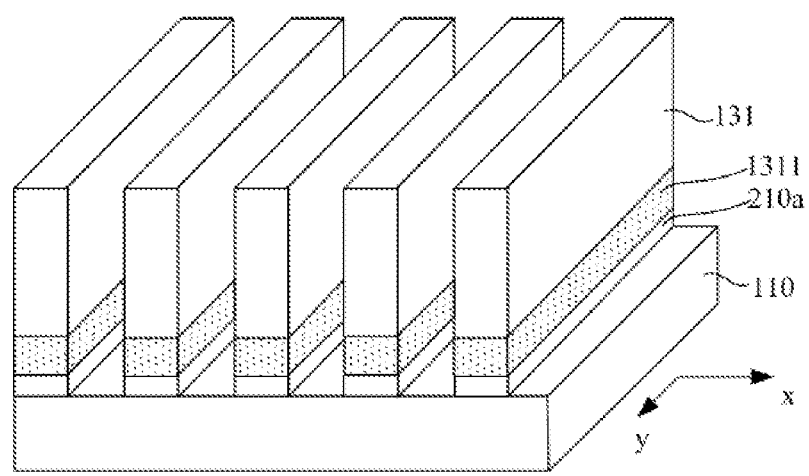
FIG. 4 is a fourth schematic structural diagram of a process of forming a semiconductor structure according to an embodiment of this disclosure.

Referring to FIG. 4, by the diffusion treatment, at least part of the doping elements in the transitional layer 310 (refer to FIG. 3) with doping atoms are diffused into each active line 131 so as to form the first doped region 1311.

The diffusion treatment may refer to a thermal annealing process. Based on a diffusion rate of the doping atoms, an annealing process with appropriate parameters can be selected, and the doping elements in the transitional layer 310 are diffused into the active line 131 so as to form the first doped region 1311 with a thickness equivalent to that of the transitional layer 310.

By adjusting concentrations of the doping elements in the transitional layer 310, diffusion treatment time, temperature, etc., an internal doping concentration of the first doped region 1311 formed after the diffusion treatment can be adjusted.

In other embodiments, after the patterning mask layer on the top of the active line 131 is removed, the active line 131 is directly doped through ion implantation to form the first doped region 1311. Specifically, by controlling ion implanting energy and direction during the ion implantation and adjusting an implantation depth, the first doped region 1311 is formed at the bottom of the active line 131.

In other embodiments, alternatively, the first doped region can be formed at the bottom of the active line or the active column by means of ion implantation in other subsequent steps, for example, after the active line is subsequently patterned to form the active column, or in other steps.

In other embodiments, alternatively, the in-situ doping process can be adopted, in the process of forming the active layer through deposition by the epitaxy process, to dope the active layer to form the first doped region located at the bottom of the active layer. After the active layer is patterned, the first doped region located at the bottom of the active line is formed.

Figure 5:
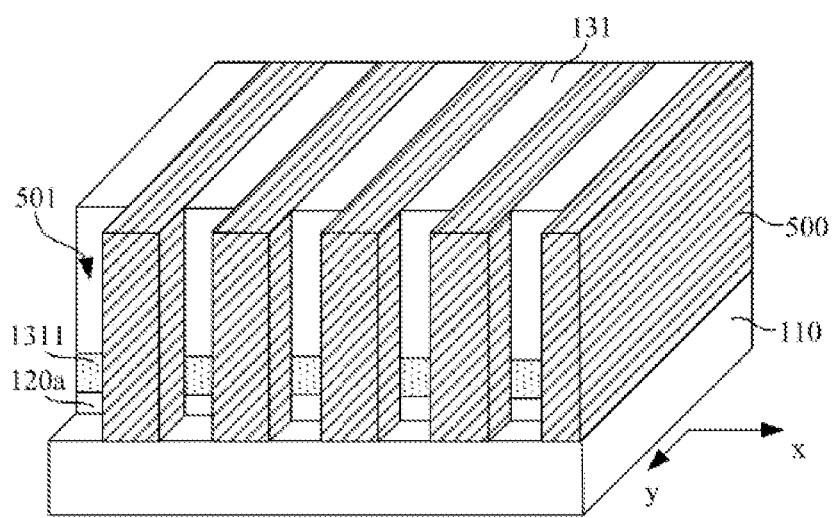
FIG. 5 is a fifth schematic structural diagram of a process of forming a semiconductor structure according to an embodiment of this disclosure.

Referring to FIG. 5, a first isolation layer 500 filling the spacing between the various active lines 131 is formed on the substrate 110. An end of the active line 131 is etched to form an opening 501, and the sacrificial layer 120a is exposed to a side wall of the opening 501.

The first isolation layer 500 and the sacrificial layer 120a are made of different materials. The first isolation layer 500 is made of an insulating material, and used for providing an electric isolation between the active lines 131. In the embodiment, the first isolation layer 500 is made of a material of silicon oxide. In the embodiment, the first isolation layer 500 is formed by a chemical vapor deposition method. After an isolation material layer that fills the spacing between the adjacent active lines 131 and covers the tops of the active lines 131 is formed on the substrate 110, the isolation material layer is subjected to planarization to form the first isolation layer 500. In the embodiment, a top of the first isolation layer 500 is flush with the top of each active line 131. In other embodiments, a patterning mask layer used for patterning of the active layer is remained on the top of the active line 131, and the first isolation layer 500 is flush with the patterning mask layer. In other embodiments, the patterning mask layer has been removed before forming of the first isolation layer 500, and the first isolation layer 500 still covers the top of the active line, which can protect the top of the active line 131 in a subsequent process.

After the isolation layer 500 is formed, one end of the active line 131 is etched to form the opening 501. The opening 501 exposes the sacrificial layer 120a. Specifically, a bottom of the opening 501 can expose the substrate 110, or can be located in the sacrificial layer 120a, as long as the bottom of the opening 501 at least exposes part of a side wall of the sacrificial layer 120a.

As shown in FIG. 5, a plurality of openings 501 can be formed at the end portions on the same side of the various active lines 131. In other embodiments, the plurality of openings are formed at two ends of the plurality of active lines, and are in one-to-one corresponding with the active lines, and the openings, at the end portions on the same side of the active lines are spaced apart, so as to decrease a density of the openings on a local area and expand process windows.

Figure 6:
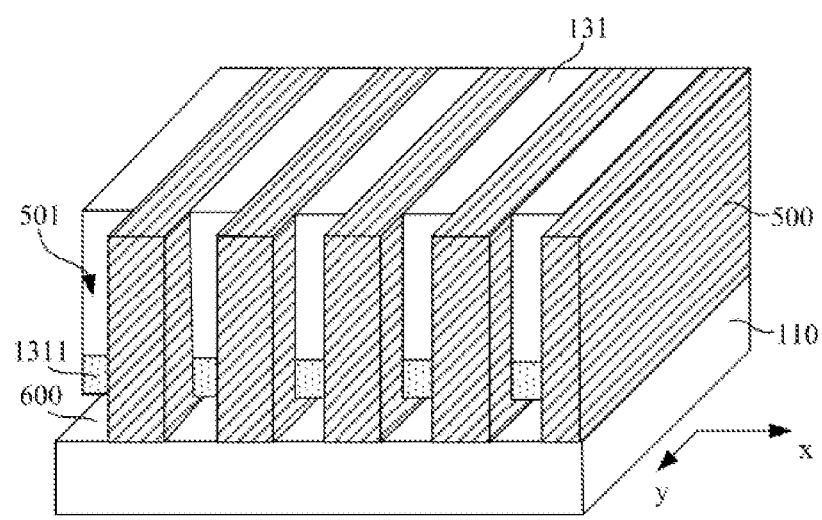
FIG. 6 is a sixth schematic structural diagram of a process of forming a semiconductor structure according to an embodiment of this disclosure.

Referring to FIG. 6, the sacrificial layer 120a is removed along the opening 501, and a gap 600 is formed between a bottom of the active line 131 and the substrate 110.

The sacrificial layer 120a is removed by a wet etching process. Those skilled in the art can select a suitable etching solution according to the material of the sacrificial layer 120a, to allow the sacrificial layer 120a to have a high etch selectivity compared with the active line 131 and the first isolation layer 500 during the wet etching process, therefore influences to the active line 131 and the first isolation layer 500 can be reduced in a process of removing the sacrificial layer 120a.

After the sacrificial layer 120a is removed, the active line 131 is supported by the first isolation layer 500, is suspended above the substrate 110, and forms the gap 600 with the substrate 110.

Figure 7A:
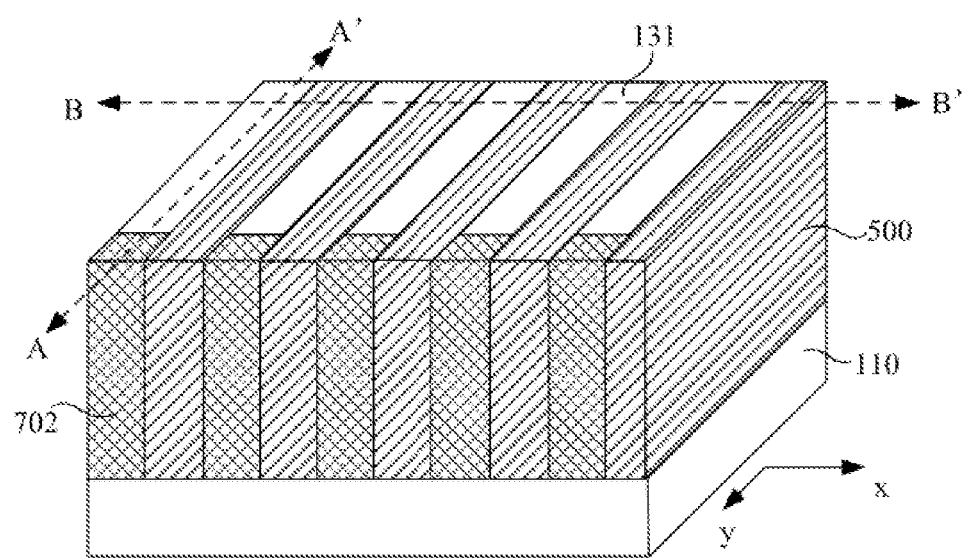
FIG. 7A is a seventh schematic structural diagram of a process of forming a semiconductor structure according to an embodiment of this disclosure.
Figure 7B:
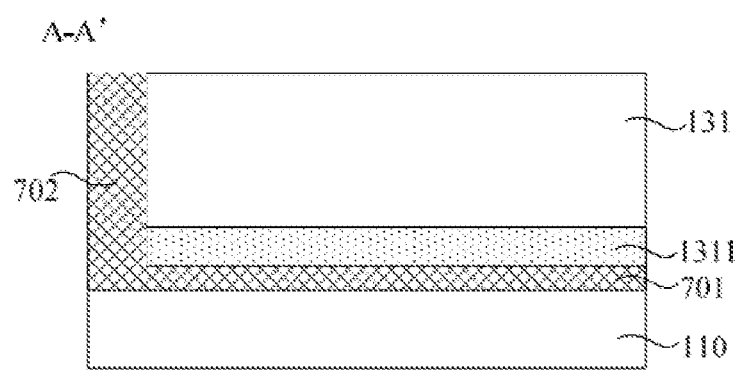
FIG. 7B is an eighth schematic structural diagram of a process of forming a semiconductor structure according to an embodiment of this disclosure.
Figure 7C:
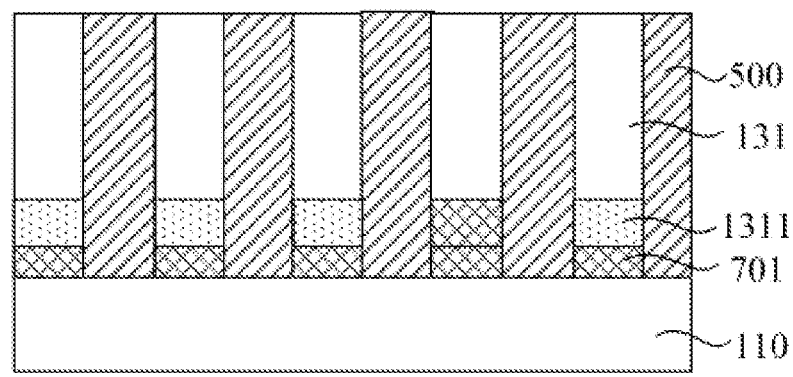
FIG. 7C is a ninth schematic structural diagram of a process of forming a semiconductor structure according to an embodiment of this disclosure.

Referring to FIG. 7A to FIG. 7C, the gap 600 is filled with a conductive material, therefore a bit line 701 extending along a first direction is formed. FIG. 7B is a cross-sectional diagram along a cutting line A-A' in FIG. 7A, and FIG. 7C is a cross-sectional diagram along a cutting line B-B' in FIG. 7A.

The conductive material such as polycrystalline silicon or a metal material, e.g., W, Co, Ag, or Al, can be formed in the gap 600 by a method such as atomic layer deposition, chemical vapor deposition, or physical vapor deposition. The conductive material can also be a multi-layer material such as a combination of TiN and W.

The conductive material fills the gap 600 to form the bit line 701 located at the bottom of the active line 131. The conductive material further fills the opening 501 and covers tops of the first isolation layer 500 and the active line 131. Subsequently, the conductive material on the tops of the first isolation layer 500 and the active line 131 can be removed by etching back or planarization treatment. The opening 501 is filled with the conductive material, therefore a bit line connecting line 702 located inside the opening 501 is formed. The bit line connecting line 702 and the bit line 701 are formed in the same processing step, thereby saving process cost. A bottom of the bit line connecting line 702 is connected to the bit line 701 for leading out of the bit line 701 buried under the active line 131, thereby facilitating application of a control signal to the bit line 701. The bit line 701 is located under the active line 131, is in electric connection with the first doped region 1311 at the bottom of the active line 131, and extends along an extension direction of the active line 131.

Figure 8:
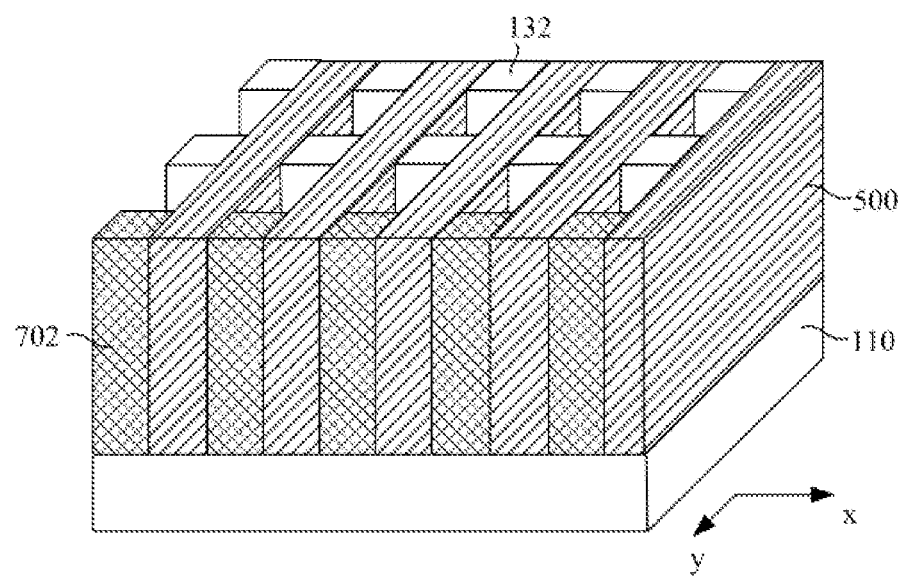
FIG. 8 is a tenth schematic structural diagram of a process of forming a semiconductor structure according to an embodiment of this disclosure.

Referring to FIG. 8, the active line 131 (refer to FIG. 7A) is patterned to form a plurality of active columns 132 that are discrete.

Through a selective etching process, the active line 131 is patterned to form the active columns 132. The active columns 132 are arranged in array along a first direction (y-direction) and a second direction (x-direction). In the embodiment, the first direction and the second direction form an angle of 90 degrees. In other embodiments, the first direction and the second direction form an angle between 60 degrees to 90 degrees.

After the active column 132 is formed, the active column can be subjected to ion implantation to form the channel region and the second doped region located above the channel region.

In the embodiment, after the active column 132 is formed, the channel region is formed above the first doped region 1311 at the bottom of the active column 132 by means of ion implantation only. An internal doping concentration of the channel regions is adjusted through ion implantation; therefore, a threshold voltage of the formed transistor is adjusted. P-type or N-type doping can be performed in the channel region. According to requirements of the threshold voltage, suitable doping types and doping concentrations can be selected. In other embodiments, doping to the channel region may not be necessary.

In other embodiments, in the foregoing process of forming the active layer 130 (refer to FIG. 1), alternatively, a doped channel region can be formed in the active layer 130 by means of in-situ doping, the active layer 130 is then patterned to obtain the active column 132, and the doped channel layer is patterned into the channel region.

In the embodiment of this disclosure, alternatively, the second doped region can be formed above the channel region through ion implantation. Or in the process of forming the active layer 130, a second doped layer is formed at a corresponding position through in-situ doping, therefore after the active layer 130 is patterned to form the active column 132, the second doped layer is patterned into the second doped region.

In other specific manners, alternatively, the active line may not be doped to form the first doped region 1311 in the foregoing step. Instead, after the active column 132 is formed in the step, the first doped region at the bottom of the active column 132 can be formed by means such as diffusion treatment of the doping transitional layer or ion implantation.

Figure 9:
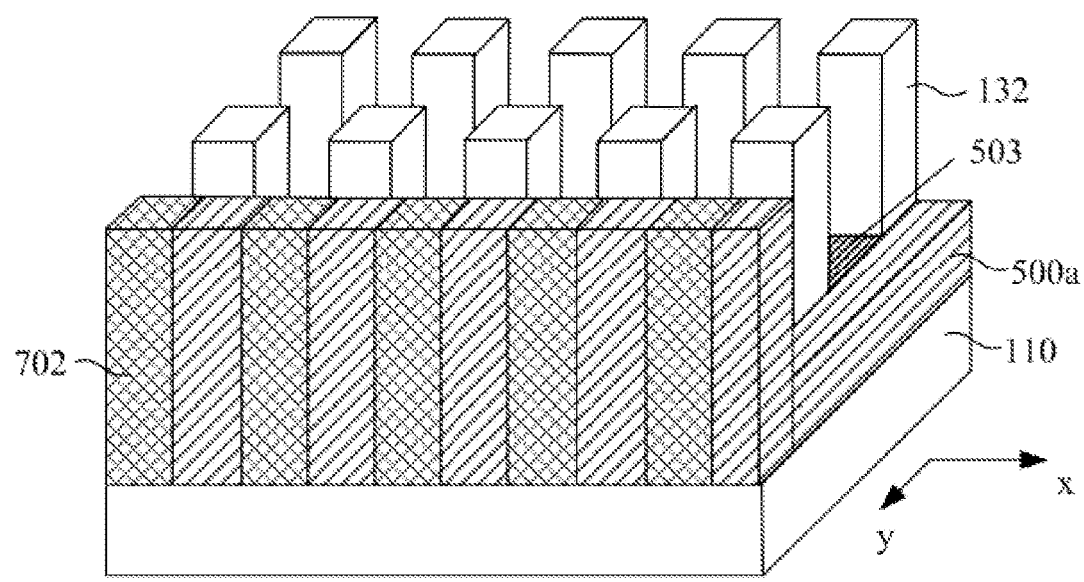
FIG. 9 is an eleventh schematic structural diagram of a process of forming a semiconductor structure according to an embodiment of this disclosure.

Referring to FIG. 9, the first isolation layer 500 is etched back to expose the active column 132 at a certain height.

Before the first isolation layer 500 is etched back, an opening between adjacent active columns 132 is filled with an isolation dielectric material, and the first isolation layer 500 and the isolation dielectric material are etched back simultaneously, therefore a first isolation layer 500a and an isolation dielectric layer 503 which are etched back are formed and have a height equivalent to that of the first doped region 1311. In the embodiment, a surface of the first isolation layer 500a etched back is flush with and the top of the first doped region 1311. In other embodiments, the surface of the first isolation layer 500a is slightly lower than or higher than a top boundary of the first doped region 1311, to expose an area, above the first doped region 1311, of the active column 132.

In the process that the first isolation layer 500 is etched back, a part of the first isolation layer 500, between the bit line 702 and the adjacent bit line connecting line 702 can be covered with a mask and prevented from being etched, therefore damage to the bit line connecting line 702 is avoided.

In other embodiments, the first isolation layer 500 at each position can be etched back.

Figure 10:
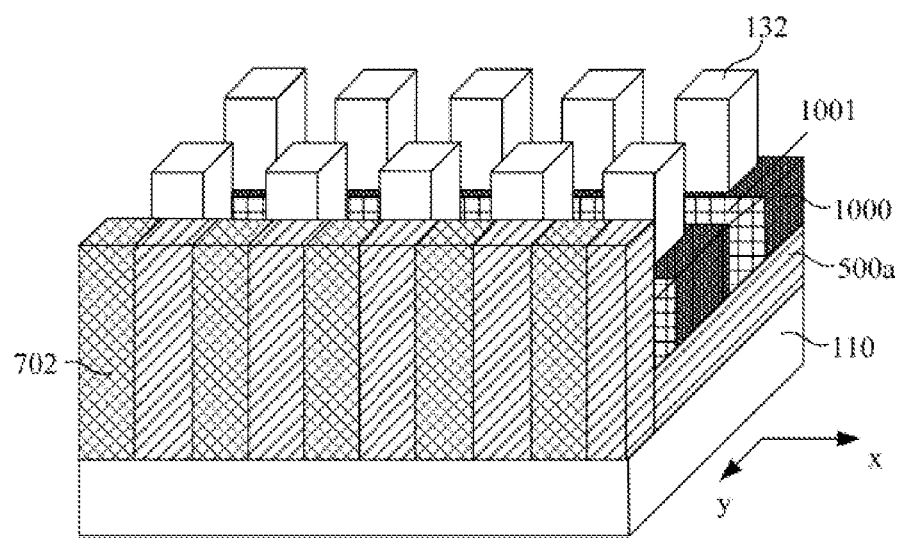
FIG. 10 is a twelfth schematic structural diagram of a process of forming a semiconductor structure according to an embodiment of this disclosure.

Referring to FIG. 10, a gate dielectric layer and a gate electrode layer are sequentially formed on the first isolation layer 500a and the isolation dielectric layer 503 which are etched back, and on the exposed active column 132; and the gate dielectric layer and the gate electrode layer are patterned to form a gate structure 1000 surrounding the channel region of the active column and expose a top area of the active column 132.

The gate dielectric layer can be a gate dielectric material such as silicon oxide, silicon oxynitride, hafnium oxide, or aluminum oxide; the gate electrode layer can be a conductive material such as polysilicon, tungsten, cobalt, or aluminum. The gate dielectric layer and the gate electrode layer sequentially covering the structure shown in FIG. 9 can be formed through a deposition process, and can be patterned through an etching process, therefore the gate structure 1000 is formed. The gate structure 1000 surrounds the channel region of the active column 132. The gate structure 1000 includes the gate dielectric layer and a gate electrode covering the gate dielectric layer. FIG. 10 only shows the gate electrode in the gate structure 1000.

In the embodiment, the gate electrodes of the gate structures 1000 on the active columns which are arranged in the same straight line along a second direction (x-direction) are mutually connected to form a word line.

In other embodiments, the gate structures 1000 on various active columns 132 may be independent to one another.

In order achieve the electric isolation between the gate structures 1000, an isolation dielectric layer 1001 fills between adjacent gate structures 1000 after the gate structures 1000 are formed.

Figure 11:
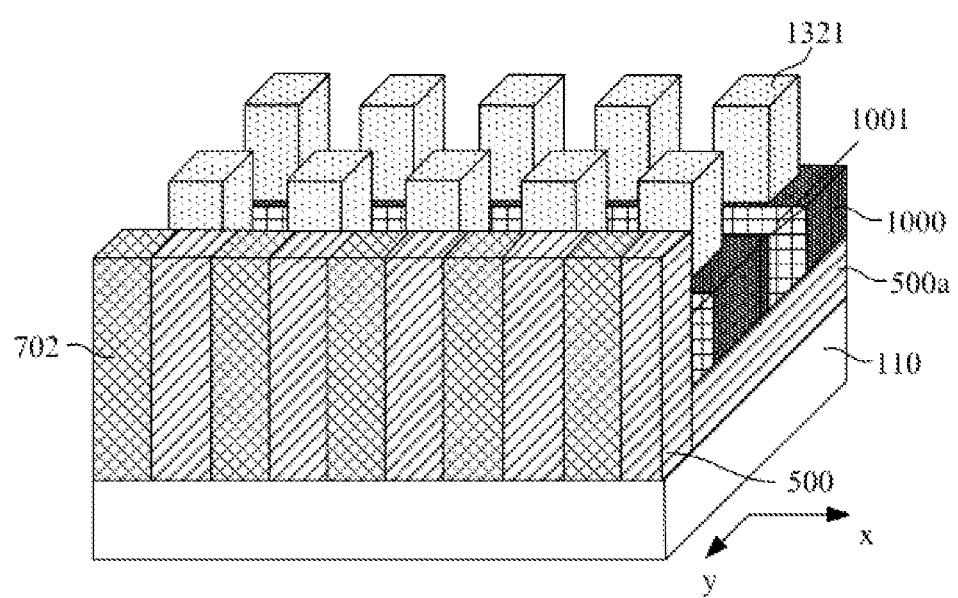
FIG. 11 is a thirteenth schematic structural diagram of a process of forming a semiconductor structure according to an embodiment of this disclosure.

Referring to FIG. 11, after the gate structure 1000 is formed, the top area of the active column 132 is subjected to ion implantation, to form the second doped region 1321.

The second doped region 1321 and the first doped region 1311 are of the same doping type, and respectively serve as a source electrode or a drain electrode of a vertical transistor. In other embodiment, the second doped region 1321 can also be formed by a suitable means such as in-situ doping, diffusion, or implantation in the foregoing step, which will not be elaborated here.

Figure 12A:
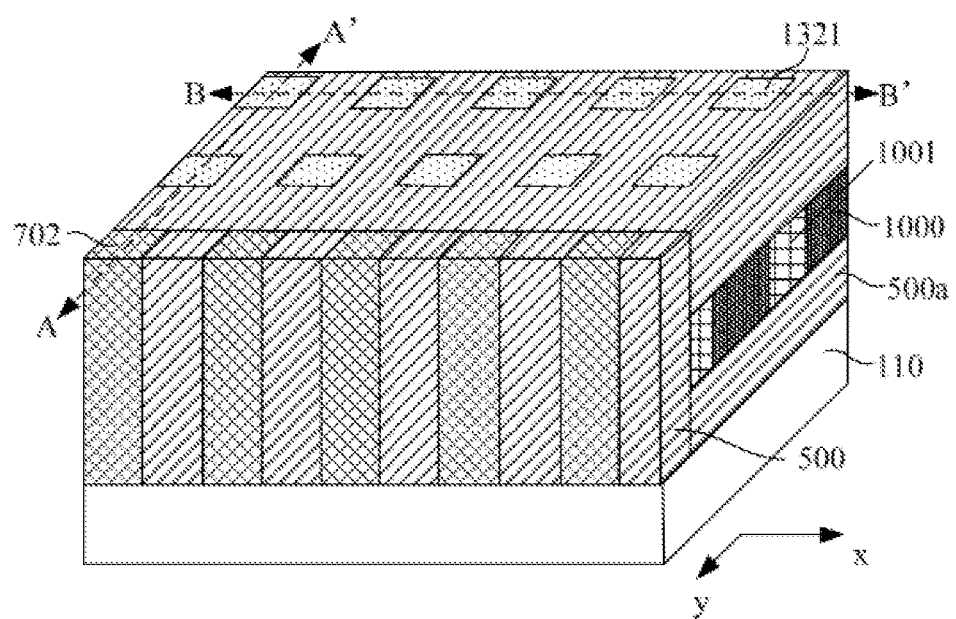
FIG. 12A is a fourteenth schematic structural diagram of a process of forming a semiconductor structure according to an embodiment of this disclosure.
Figure 12B:
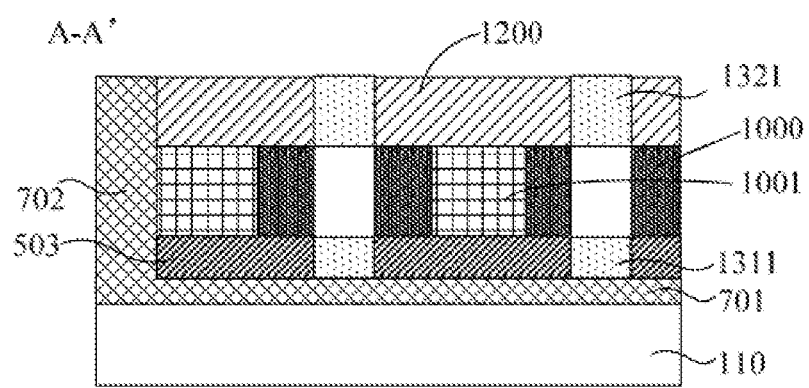
FIG. 12B is a fifteenth schematic structural diagram of a process of forming a semiconductor structure according to an embodiment of this disclosure.
Figure 12C:
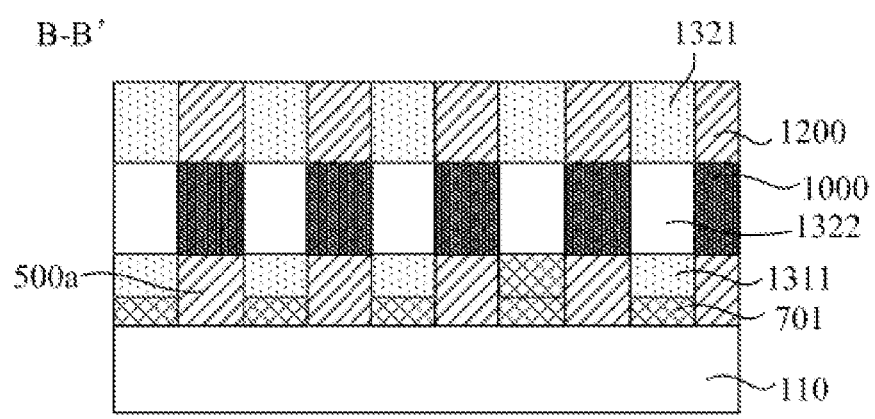
FIG. 12C is a sixteenth schematic structural diagram of a process of forming a semiconductor structure according to an embodiment of this disclosure.

Referring to FIG. 12A to FIG. 12C, a second isolation layer 1200 covering the gate structure 1000 and the second doped region 1321 is formed, and top surfaces of the bit line connecting line 702 and the second doped region 1321 are exposed by the second isolation layer 1200. FIG. 12B is a cross-sectional diagram along a cutting line A-A' in FIG. 12A, and FIG. 12C is a cross-sectional diagram of a cutting line B-B' in FIG. 12A.

The second isolation layer 1200 can be made of an insulating dielectric material such as silicon oxide, and silicon oxynitride, and forms isolation layers, together with the first isolation layers 500 and 500a, and the isolation dielectric layer 503 and 1001, among the various vertical transistors, and provides a flat surface for forming of other semiconductor structures or material layers above the vertical transistor.

By the foregoing method, the vertical transistor is formed on the substrate, the buried bit line is formed between the position under the first doped region at the bottom of the vertical transistor, and the substrate, therefore area of the transistor can be reduced, and the problem that how to apply a control signal to the first doped region is solved.

Embodiments of this disclosure further provide a semiconductor structure.

Refer to FIG. 12A to FIG. 12C. FIG. 12A to FIG. 12C are schematic structural diagrams of a semiconductor structure according to an embodiment of this disclosure.

The semiconductor structure includes: a substrate 110, a vertical transistor located on the substrate 110, and a bit line 701. The vertical transistor includes a first doped region 1311, a channel region 1322, a second doped region 132, and a gate structure 1000; the first doped region 1311, the channel region 1322, and the second doped region 1321 are sequentially upwards arranged on the substrate 110, and the gate structure 1000 surrounds the channel region 1322. The bit line 701 is connected to the first doped region 1311, and is located between a bottom of the first doped region 1311 and the substrate 110.

A plurality of vertical transistors are formed on the semiconductor structure and arranged in array along a first direction (y-direction) and a second direction (x-direction). The first doped regions 1311 at bottoms of the vertical transistors arranged on the same straight line along the first direction are connected to the same bit line 701. The gate structures 1000 of the vertical transistors arranged on the same straight line along the second direction are connected mutually.

The semiconductor further includes: isolation layers arranged among the various vertical transistors on the substrate 110. The isolation layers include a first isolation layer 500a located between adjacent bit lines 701 and adjacent first doped regions 1311; an isolation dielectric layer 503 located between adjacent first doped regions 1311 on the bit line 701; an isolation dielectric layer 1001 located between adjacent gate structures 1000 on the first isolation layer 500a and the isolation dielectric layer 503, and a second isolation layer 1200 located between adjacent second doped regions 1321 on the isolation dielectric layer 1001.

The semiconductor structure further includes: an opening penetrating the active layer. A bit line connecting line 702 is formed in the opening. A bottom of the bit line connecting line 702 is connected to the bit line 701. In the embodiment, the bit line connecting line 702 is located at one edge of the transistor array. One bit line connecting line 702 is formed at one side of each line of transistors arranged along the y-direction, which is connected to the bit line 701 arranged under the line of transistors. Specifically, the openings are formed at the end portions of the same side of the various active lines, or the openings are formed at two ends of the active lines. Only one end portion of each active line is provided with the opening. The openings at the end portions on the same side are spaced apart to decrease a density of the openings formed on a local area and expand process windows.

In some embodiments, the first doped region 1311, the channel region 1322, and the second doped region 1321 of each vertical transistor are located in the same active column. The active column is of an integral structure. The first doped region 1311, the channel region 1322, and the second doped region 1321 are formed by doping. In other embodiments, in the process of forming the active layer 130 (refer to FIG. 1), alternatively, a first doped layer, a doped channel layer, and a second doped layer can be formed in the active layer 130 through in-situ doping; after the active layer 130 is patterned to form the active column 132, the first doped layer is patterned into the first doped region 1311, the doped channel layer is patterned into the channel region 1322, and the second doped layer is patterned into the second doped region 1321. In other embodiments, the channel region 1322 and the second doped region 1321 of the vertical transistor are formed in an epitaxial semiconductor column on the first doped region 1311. A semiconductor layer where the channel region 1322 and the second doped region 1321 are located and the epitaxial semiconductor column are not an integral structure, but are separately formed.

Doped ions in the first doped region 1311 and/or the second doped region 1321 are formed by means of diffusion or ion implantation.

Embodiments of this disclosure further provide a memory and a method for forming the same.

Firstly, the semiconductor structure as shown in FIG. 12A to FIG. 12C is provided. Refer to the above-mentioned embodiments for a specific description of the semiconductor structure, which will not be elaborated here.

Figure 13:
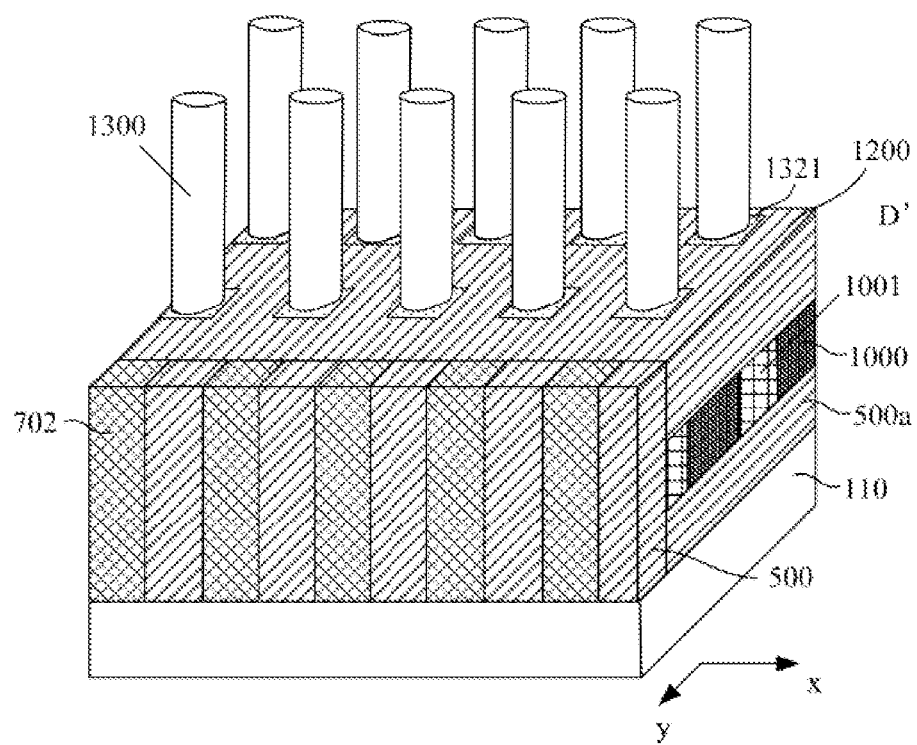
FIG. 13 is a schematic structural diagram of a memory according to an embodiment of this disclosure.

Referring to FIG. 13, a memory cell 1300 is formed on the vertical transistor, and is electrically connected to the second doped region 1321 of the vertical transistor.

In one embodiment, the memory refers to a DRAM. The memory cell 1300 refers to a capacitor including a top electrode, a bottom electrode, and a capacitor dielectric layer between the top electrode and the lower electrode. The capacitor can be of a structure such as a planar capacitor, and a cylindrical capacitor. Those skilled in the art may select the capacitor of the suitable structure as the memory cell according to needs. In FIG. 13, the memory cell 1300 is only an example, which does not represent the actual structure of the capacitor. In the embodiment, the second doped region 1321 of each transistor is connected to one memory cell to form a 1T1C storage structure. The memory cell can include a capacitor, or two or more capacitors connected in parallel.

In other embodiments, alternatively, in order to reduce a connection resistance between the second doped region 1321 and the memory cell 1300, a metal contact layer can be formed on the second doped layer 1321, and the memory cell is formed on the metal contact layer.

The memory cell 1300 is formed in a dielectric layer (not shown in the figure), alternatively, an interconnecting structure for connecting the bit line connecting line 702 and the gate structure 1000 can be formed in the dielectric layer, for connecting the bit line and word line to an external circuit.

In other embodiments of this disclosure, alternatively, the memory cell can include any of various memory cells such as a capacitive memory cell, a magnetic memory cell, a ferroelectric memory cell, a phase change memory cell, or a resistive memory cell.

Figure 14:
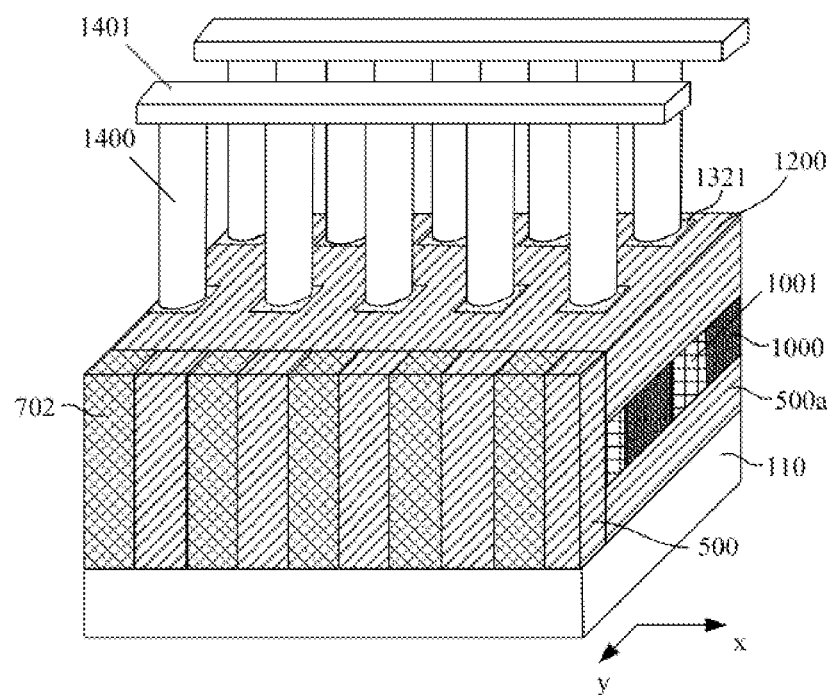
FIG. 14 is another schematic structural diagram of a memory according to an embodiment of this disclosure.

FIG. 14 is a schematic structural diagram of a memory according to an embodiment of this disclosure.

The memory is a Ferroelectric Random-Access Memory (FeRAM). A ferroelectric memory cell 1400 in electric connection is formed on the second doped region 1321 of each vertical transistor of the semiconductor structure shown in FIG. 12A.

The ferroelectric memory cell includes a bottom electrode connected to the second doped region 1321, a top electrode above the bottom electrode, and a ferroelectric capacitor, formed by a ferroelectric material layer, between the top electrode and the bottom electrode. The ferroelectric material layer can be made of a material of PZT (Pb-based lanthanum-doped zirconate titanates) or SBT (barium-strontium titanates). The ferroelectric memory cell 1400 in FIG. 14 is only an example, which does not represent the actual structure of the ferroelectric memory cell. Those skilled in the art should select the ferroelectric memory cell 1400 of a corresponding structure according to needs, which is not limited herein.

For the ferroelectric memory cell 1400, a plate line 1401 connected to the top electrode is required to be formed on the ferroelectric memory cell 1400. In the embodiment, the ferroelectric memory cells which are arranged on the same straight line along a second direction (x-direction) are connected to the same plate line 1401. By means of the plate line 1401 and the vertical transistor below, two-way pressurization to the ferroelectric memory cell 1400 can be achieved, therefore data storage is carried out according to properties of the ferroelectric material layer.

In other embodiments, a magnetic memory cell can also be formed on the second doped region 1321 of the vertical transistor. The magnetic memory cell includes a magnetic tunneling junction. The magnetic tunneling junction includes a fixed layer, a free layer, and a dielectric layer located between the fixed layer and the free layer. The fixed layer is connected to the second doped region 1321.

In other embodiments, alternatively, a memory cell of other structures or types may be formed, so as to form a corresponding memory.

According to the memory and the method for forming a memory, the vertical transistor serving as a control transistor connected to the memory cell, and the buried bit line connected to the control transistor are used, which can increase a storage density of the memory.

The above are merely the preferred implementation manners of this disclosure. It should be pointed out that those of ordinary skill in the art may also make several improvements and modifications without departing from the principle of this disclosure. These improvements and modifications shall fall within the scope of protection of this disclosure.

What is claimed is:

1. A method for forming a semiconductor structure, comprising:
   providing a substrate, wherein a sacrificial layer and an active layer on the sacrificial layer are formed on the substrate;
   etching the active layer and the sacrificial layer to form active lines along a first direction;
   forming a first isolation layer that fills spacing between the active lines;
   etching end portions of the active lines to form openings exposing the sacrificial layer;
   removing the sacrificial layer along the openings, and forming gaps between a bottom of the active lines and the substrate;
   filling the gaps with a conductive material to form bit lines extending along the first direction;
   patterning the active lines to form a plurality of active columns that are discrete, the plurality of active columns being arranged in an array along the first direction and a second direction; and
   forming a first doped region, a channel region, and a second doped region that are located on a bottom of an active column and sequentially arranged upwards, and forming a gate structure surrounding the channel region;
   wherein a method for forming the first doped region comprises: forming a transitional layer with doping elements on the substrate between adjacent active lines or active columns, after the active lines or active columns are formed; and through diffusion treatment, diffusing at least part of the doping elements in the transitional layer into the active line or the active column to form the first doped region.

2. The method for forming a semiconductor structure according to claim 1, further comprising: filling the openings with the conductive material to form bit line connecting lines located in the openings, wherein a bottom of the bit line connecting lines is connected to the bit lines.

3. The method for forming a semiconductor structure according to claim 2, wherein the bit line connecting lines and the bit lines are formed in a same processing step.

4. The method for forming a semiconductor structure according to claim 1, wherein a method for forming the first doped region comprises: performing ion implantation to the active column to form the first doped region located at the bottom of the active column.

5. The method for forming a semiconductor structure according to claim 1, wherein a method for forming the first doped region, the channel region, and the second doped region comprises: using an in-situ doping process, in the process of forming the active layer, doping the active layer to sequentially form a first doped layer, a channel doped layer, and a second doped layer; and after patterning the active layer to form the active column, the first doped layer, the channel doped layer, and the second doped layer are respectively patterned into the first doped region, the channel region, and the second doped region.

6. The method for forming a semiconductor structure according to claim 1, wherein a method for forming the gate structure comprises: etching back the first isolation layer to expose a part of the height of the active column; sequentially forming a gate dielectric layer and a gate electrode layer on the first isolation layer of having been etched back and on the exposed active column; and patterning the gate dielectric layer and the gate electrode layer to form the gate structure surrounding the channel region of the active column and expose a top area of the active column.

7. The method for forming a semiconductor structure according to claim 6, wherein the gate structures on the plurality of active columns arranged on a same straight line along the second direction are connected.

8. The method for forming a semiconductor structure according to claim 6, wherein after the gate structure is formed, ion implantation is performed on the top area of the active columns to form the second doped region.

9. The method for forming a semiconductor structure according to claim 1, wherein a plurality of openings are formed at two ends of the plurality of active lines, and the plurality of openings correspond to the active lines on a one-to-one basis, and the openings at ends of a same side of the active lines are distributed at intervals.

* * * * *